United States Patent [19]
Lee et al.

[11] Patent Number: 5,396,114
[45] Date of Patent: Mar. 7, 1995

[54] CIRCUIT FOR GENERATING SUBSTRATE VOLTAGE AND PUMPED-UP VOLTAGE WITH A SINGLE OSCILLATOR

[75] Inventors: Jae-Heong Lee; Dong-Jae Lee, both of Seoul, Rep. of Korea

[73] Assignee: Samsung Electronics Co., Ltd., Suwon, Rep. of Korea

[21] Appl. No.: 997,302

[22] Filed: Dec. 23, 1992

[30] Foreign Application Priority Data

Dec. 23, 1991 [KR] Rep. of Korea ............... 1991-23944

[51] Int. Cl.[6] .................... H03L 5/00; H03K 3/354
[52] U.S. Cl. .................................. 327/535; 323/313; 327/530; 327/537; 327/538; 327/540; 327/543; 327/545; 327/546
[58] Field of Search .............. 307/296.1, 296.2, 296.3, 307/296.4, 296.5, 296.6, 296.8, 304; 323/313; 365/189.09

[56] References Cited

U.S. PATENT DOCUMENTS

| | | | |
|---|---|---|---|
| 4,385,337 | 5/1983 | Asano et al. | 307/296.2 |
| 4,471,290 | 9/1984 | Yamaguchi | 307/296.2 |
| 4,585,954 | 4/1986 | Hashimoto et al. | 307/296.2 |
| 4,820,936 | 4/1989 | Veendrick et al. | 307/296.2 |
| 4,961,007 | 10/1990 | Kumanoya et al. | 307/296.2 |
| 4,964,082 | 10/1990 | Sato et al. | 307/296.2 |
| 5,034,625 | 7/1991 | Min et al. | 307/296.2 |
| 5,041,739 | 8/1991 | Goto | 307/296.2 |
| 5,072,134 | 12/1991 | Min | 307/296.2 |
| 5,113,088 | 5/1992 | Yamamoto et al. | 307/296.2 |

Primary Examiner—Terry D. Cunningham
Attorney, Agent, or Firm—Charles R. Donohoe; Robert A. Westerlund, Jr.; Stephen R. Whitt

[57] ABSTRACT

A constant voltage generator having a substrate voltage pumping circuit, a voltage pumping circuit and a single oscillator for generating pulses to which the substrate voltage pumping circuit and the voltage pumping circuit are commonly responsive, reducing current consumption of a semiconductor memory device during a stand-by state thereof.

4 Claims, 3 Drawing Sheets

CIRCUIT FOR GENERATING SUBSTRATE VOLTAGE AND PUMPED-UP VOLTAGE WITH A SINGLE OSCILLATOR

BACKGROUND OF THE INVENTION

1. Field of the Invention

The present invention relates generally to semiconductor memory devices and more particularly to a circuit for generating a substrate voltage and a pumped-up voltage with a single oscillator.

2. Description of the Related Art

In general, an operating voltage of a semiconductor memory device tends to decrease as the density of semiconductor memory devices on a chip increase. For instance, a 16Mbit dynamic RAM uses an operating voltage of 4V whereas a 64Mbit dynamic RAM uses a 3.3V operating voltage. The operating voltage is derived from an external supply voltage of 5V. Along with the trends toward lowering operating voltages, continuous research has been made into reducing the power consumption of semiconductor memory devices. To that end, a circuit for generating a constant voltage is generally included in semiconductor memory devices. For instance, in a semiconductor memory device such as a dynamic RAM or pseudo static RAM comprised of one storage capacitor and one access transistor, a substrate voltage generator is necessarily used to retain data stored in the storage capacitor and a noise margin of the memory device. In addition, a boosting circuit or a voltage pumping circuit is also used for generating an increased voltage higher than the external supply voltage in order to compensate for the voltage loss by the access transistor, caused by the driving operation of a word line coupled to a memory cell to be accessed.

FIG. 1 illustrates a conventional substrate voltage generator. An oscillator 1 generates pulses φOSC upon power-on of a semiconductor memory device. A substrate voltage driver 2 receives the pulses φOSC to generate complementary driving signals. A substrate voltage pumping circuit 3 generates a substrate voltage $V_{BB}$ in response to the driving signals from the substrate voltage pumping circuit 2. A substrate voltage detector 4 detects the level of the substrate voltage output of the substrate voltage pumping circuit 3 to control operation of the oscillator 1 according to the detection. The substrate voltage detector 4 controls the operation of the oscillator 1 through a transistor 6 and inverter 5. In operation, the oscillator 1 generates the pulses φOSC having a period of 60-100 ns upon power-on of the semiconductor memory device. Then, the substrate voltage driver 2 receives the pulses φOSC and generates complementary square wave driving signals. The substrate voltage pumping circuit 3 pumps up the substrate voltage $V_{BB}$ in response to the driving signals until the substrate voltage reaches a predetermined level. Meanwhile, if the substrate voltage $V_{BB}$ reaches the predetermined voltage, then the detector 4 causes the oscillator 1 to stop generating the pulses φOSC in response to the detection result. On the contrary, however, if the substrate voltage $V_{BB}$ is below the predetermined voltage level, the detector 4 allows the oscillator 1 to generate the pulses φOSC so as to pump up the substrate voltage $V_{BB}$.

FIG. 2 shows a conventional voltage pumping circuit. The structure and operation of the voltage pumping circuit are similar to those of the substrate voltage generator of FIG. 1. However, a voltage pumping circuit 13 replaces the substrate voltage pumping circuit 3 and generates a pumped-up voltage instead of the substrate voltage. A pumped up voltage detector 14 replaces the substrate voltage detector 4 also. The pumped-up voltage is generally used as a supply voltage of the peripheral circuits such as a data output buffer and a word line driver.

The substrate voltage generator shown in FIG. 1 and the voltage pumping circuit illustrated in FIG. 2 are both necessarily included in a semiconductor memory device. The substrate voltage pumping circuit 3 of FIG. 1 is comprised of a number of MOS capacitors for pumping up the substrate voltage negatively. A voltage pumping circuit 13 of FIG. 2 is also comprised of a number of MOS capacitors for pumping up the pumped-up voltage higher than the external supply voltage. Conventionally, the substrate voltage generator of FIG. 1 and the voltage pumping circuit of FIG. 2 have separate oscillators 1 and 11.

A typically known oscillator which may be used for the oscillators 1 and 11 is described in detail in FIG. 3. The oscillator shown in FIG. 3 is described to emphasize the amount of current a typical oscillator drains. Therefore, a complete functional description is omitted. The operation of the oscillator in FIG. 3 should be apparent to those skilled in the art.

Such an oscillator consumes a large amount of current, particularly during a stand-by mode of the semiconductor memory device. For example, if it is assumed that the operating voltage and the total current consumption of the semiconductor memory device during the stand-by state are 3.3V and 50 μA respectively, the current consumption of the oscillator is 20 μA which becomes 2/5 of the total current consumption of the semiconductor memory device. Such stand-by current by the oscillator prevents reduction of the current consumption of the semiconductor memory device. Accordingly, if two separate oscillators are used for a semiconductor memory device, the stand-by current of the oscillators becomes 4/5 of the total current consumptions of the semiconductor memory device thereby resulting in an increase of the current consumption.

SUMMARY OF THE INVENTION

It is therefore an object of the present invention to provide a semiconductor memory device with a lower stand-by current consumption.

It is another object of the present invention to provide a circuit for generating a substrate voltage and a pumped-up voltage with a single oscillator.

Accordingly, one embodiment of the constant voltage generator of the present invention comprises a substrate voltage pumping circuit, a voltage pumping circuit and a single oscillator for generating pulses to which the substrate voltage pumping circuit and the voltage pumping circuit respond, so as to reduce current consumption of a semiconductor memory device during a stand-by state thereof.

BRIEF DESCRIPTION OF THE DRAWINGS

For a better understanding of the invention and to show how the same may be carried into effect, reference will now be made, by way of example, to the accompanying drawings, in which.

DETAILED DESCRIPTION OF THE PREFERRED EMBODIMENT

Figure 4:
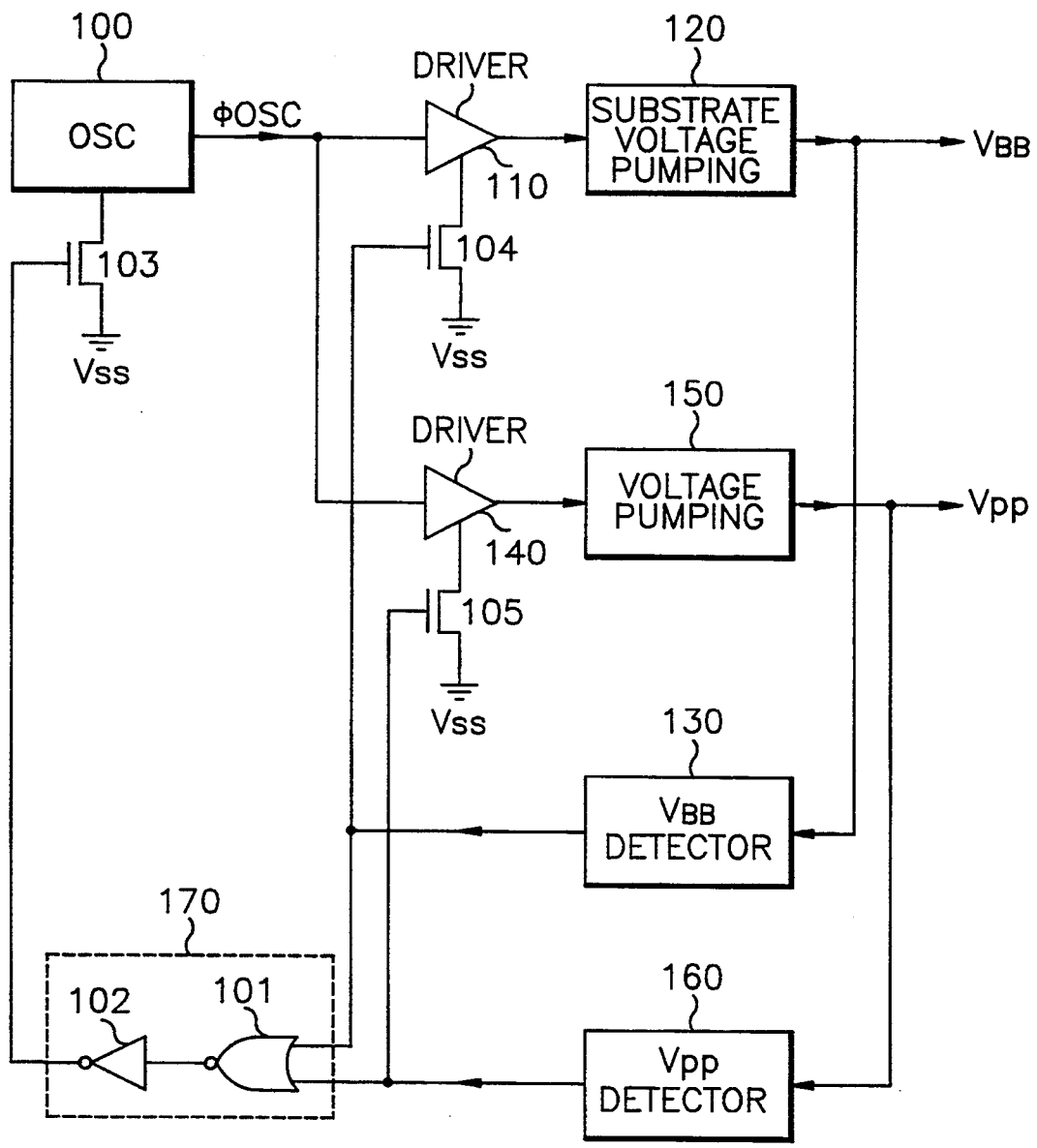
FIG. 4 shows a circuit for generating a substrate voltage and a pumped-up voltage with a single oscillator according to the present invention.

As shown in FIG. 4, one embodiment of a circuit for generating substrate voltage and pumped-up voltage with a single oscillator in accordance with the present invention is generally described. An oscillator 100 is connected to the inputs of both a substrate voltage driver 110 and a voltage pumping driver 140. An NMOS transistor 104 is connected between the substrate voltage driver 110 and Vss. A substrate voltage pumping circuit 120 receives an input from the substrate voltage driver 110 and outputs substrate voltage (VBB). Substrate voltage (VBB) detector circuit 130 senses VBB and generates a detector signal which is supplied to the gate of the NMOS transistor 104 and an oscillator controller 170. An NMOS transistor 105 is connected between the voltage pumping driver 140 and Vss. A voltage pumping circuit 150 receives an input from the voltage pumping driver 140 and outputs pumped-up voltage (VPP). A Vpp detector circuit 160 senses VPP and generates a detection signal which is supplied to the gate of the NMOS transistor 105 and the oscillator controller 170. The oscillator controller comprises a NOR gate 101 receiving inputs from the VPP detector 160 and VBB detector 130 and an inverter 102 outputting results therefrom to the gate of NMOS transistor 103 connected between the oscillator 100 and Vss.

The oscillator 100 generates square pulses φOSC upon power-on of the semiconductor memory device. The substrate voltage driver 110 receiving the pulses φOSC from the oscillator 100 generates complementary substrate voltage driving signals. The substrate voltage pumping circuit 120 receiving the substrate voltage driving signals pumps the substrate voltage VBB up to a predetermined level. The substrate voltage detector 130 detects the level of the substrate voltage output from the substrate voltage pumping circuit 120 to provide a substrate voltage control signal to the oscillator 100 and the gate of the NMOS transistor 104 which enables/disables the substrate voltage driver 110 according to the result of the detection.

The voltage pumping driver 140, that also receives the pulses φOSC, generates complementary voltage pumping drive signals. The voltage pumping circuit 150 receiving the voltage pumping driving signals pumps the pumped-up voltage $V_{pp}$ up to a predetermined level. The pumped-up voltage detector 160 detects the level of the pumped-up voltage $V_{pp}$ output from the voltage pumping circuit 150 and provides a pumped-up voltage control signal to the oscillator 100 and to the gate of the NMOS transistor 105 which, in turn, enables/disables the voltage pumping driver 140 according to the result of the detection. The oscillator controller 170 receives the substrate voltage control signal and the pumped-up voltage control signal so as to provide an oscillator control signal to the gate of transistor 103 which enables/disables the oscillator 100.

Figure 1:
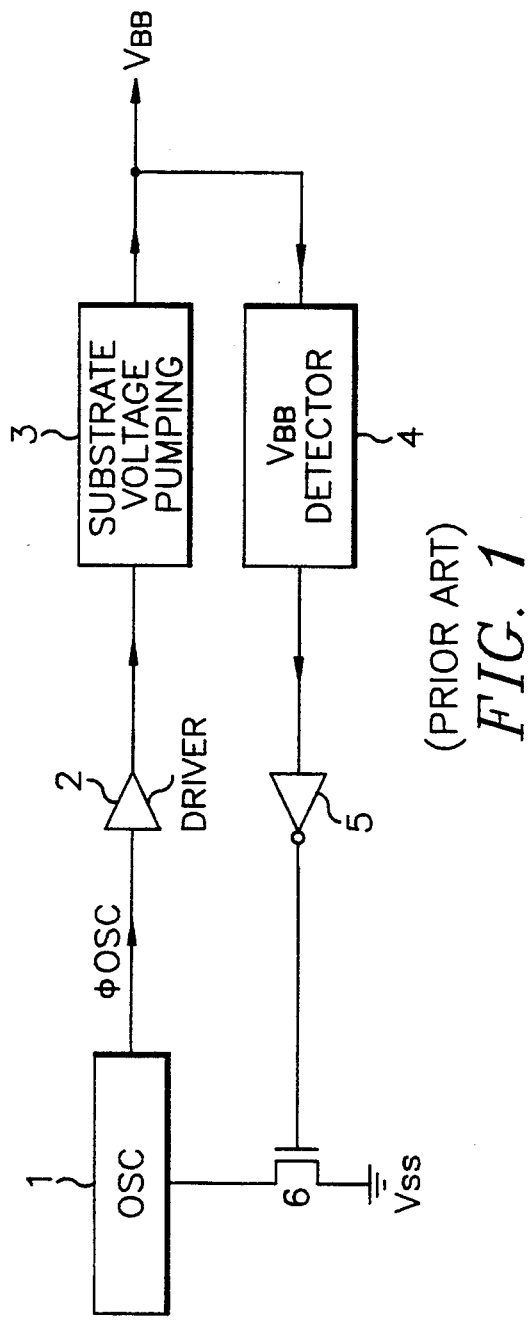
FIG. 1 shows a block diagram of a conventional substrate voltage generator.
Figure 2:
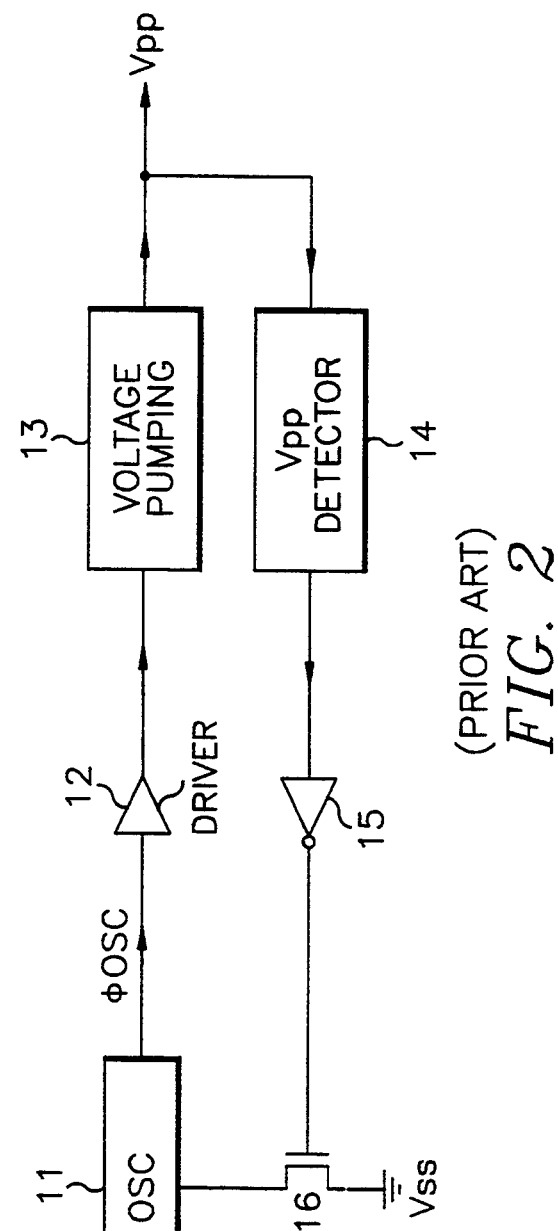
FIG. 2 shows a block diagram of a conventional voltage pumping circuit.
Figure 3:
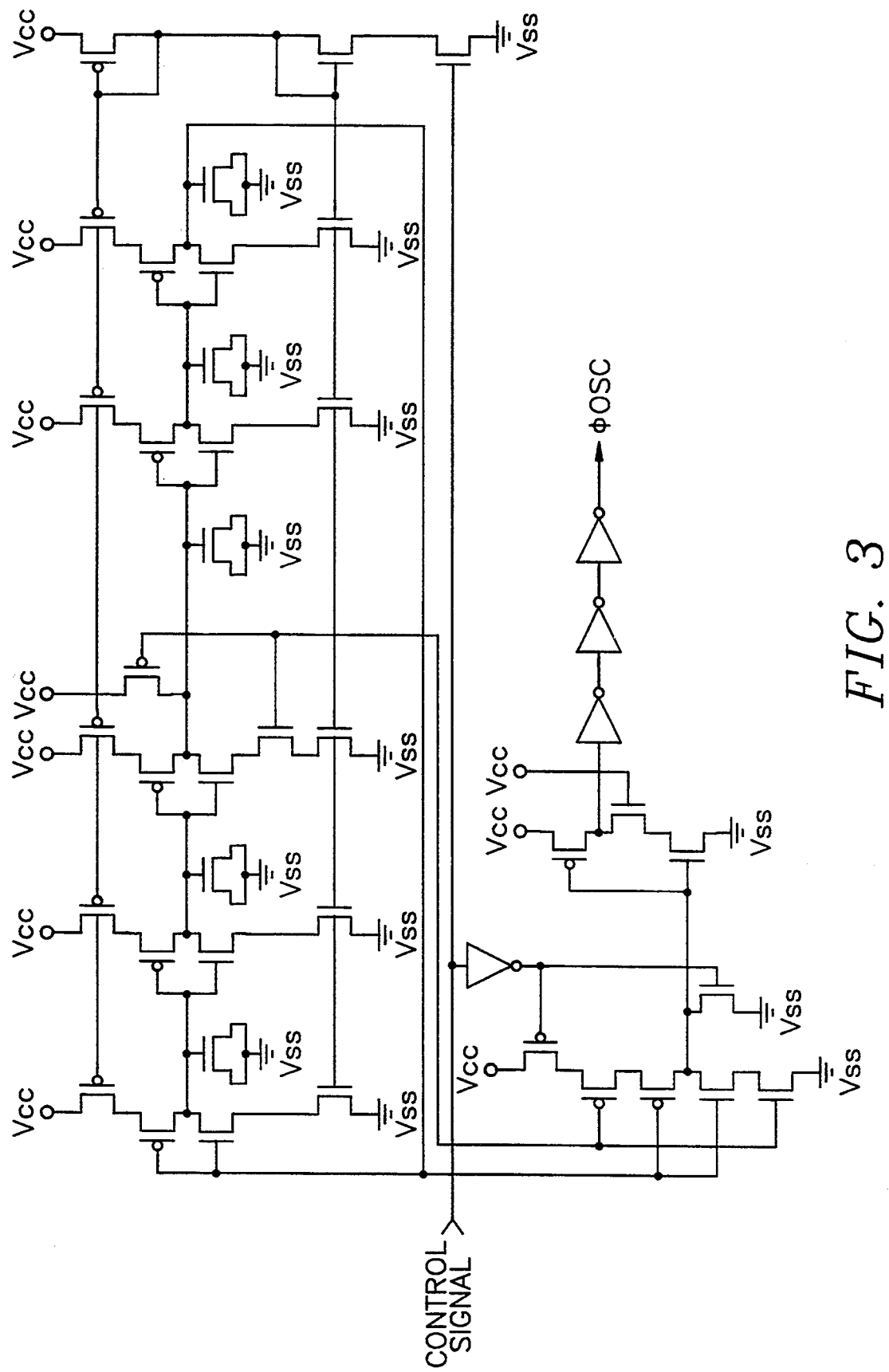
FIG. 3 shows an oscillator which can be used in the convention substrate voltage generator and the voltage pumping circuits of FIGS. 1 and 2 as well as the constant voltage generator of the present invention.

In the foregoing description, the oscillator 100, the substrate voltage driver 110, the voltage pumping driver 140, the substrate voltage pumping circuit 120, the voltage pumping circuit 150, the substrate voltage detector 130 and the pumped-up voltage detector 160 each have the same structures as those in FIGS. 1 and 2. Further, the oscillator controller 170 comprised of the NOR gate 101 and the inverter 102 shows a preferred embodiment in accordance with the present invention.

With reference to the foregoing structure, operation of the present invention will now be described in detail below. First of all, the circuit according to the present invention is greatly enhanced with the substrate voltage generating section and the pumped-up voltage generating section sharing a single oscillator, so the stand-by current of the semiconductor memory device may be considerably reduced. In operation, the oscillator 100 generates pulses φOSC having a period of 60–100 ns upon power-on of the semiconductor memory device.

The substrate voltage driver 110 and the voltage pumping driver 140 receive the pulses φOSC commonly and generate the substrate voltage driving signals and the voltage pumping driving signals, respectively. The substrate voltage pumping circuit 120 and the voltage pumping circuit 150 generate the substrate voltage $V_{BB}$ and the pumped-up voltage $V_{pp}$ in response to the substrate voltage driving signals and the voltage pumping driving signals, respectively. The voltage level of the substrate voltage $V_{BB}$ is detected by the substrate voltage detector 130. In response to the result of the detection, the oscillator 100 and the substrate voltage driver 110 are controllably operated.

As shown in the drawing, it should be noted that the substrate voltage detector 130 is coupled to directly control operation of the substrate voltage driver 110. Therefore, the substrate voltage pumping circuit 120 may not be influenced by the pulses φOSC generated from the oscillator 100, even if the oscillator 100 continues to generate the pulses φOSC in order to allow the voltage pumping driver 140 and the voltage pumping circuit 150 to pump the pumped-up voltage $V_{pp}$ up to a predetermined voltage level.

In the same way, the pumped-up voltage detector 160 is coupled to directly control operation of the voltage pumping driver 140, so that the voltage pumping circuit 150 may not be influenced by the pulses φOSC generated from the oscillator 100, even if the oscillator 100 continues to generate the pulses φOSC in order to allow the substrate voltage driver 110 and the substrate voltage pumping circuit 120 to pump the substrate voltage $V_{BB}$ up to a predetermined voltage level. Further, it can be readily appreciated that the oscillator 100 operates to generate the pulses φOSC when one or both of the substrate voltage $V_{BB}$ and the pumped-up voltage $V_{pp}$ are below the corresponding predetermined voltage levels.

As described above, the present novel circuit has a single oscillator to generate the substrate voltage and the pumped-up voltage, so that the current consumed by the oscillator during the stand-by state of the semiconductor memory device may be reduced to half in comparison with the prior art. Further, by using a single oscillator, the novel circuit is advantageous because it allows increased density of semiconductor memory devices on a chip.

While the invention has been particularly shown and described with reference to a preferred embodiment, it will be understood by those skilled in the art that modifications in detail may be made without departing from the spirit and scope of the invention. For example, the oscillator, the drivers, the pumping circuits and the detectors can include any improved circuits known in this technical field.

What is claimed is:

1. A constant voltage generator comprising:
   a substrate voltage pumping circuit, generating a substrate voltage;
   a voltage pumping circuit, generating a supply voltage;
   means for generating pulses to which said substrate voltage pumping circuit and said voltage pumping circuit are commonly responsive;
   a first detector detecting said substrate voltage of said substrate voltage pumping circuit and generating a substrate voltage control signal for controlling operation of said substrate voltage pumping circuit according to results of said detected substrate voltage;
   a second detector detecting said supply voltage of said voltage pumping circuit and generating a pumped-up voltage control signal for controlling operation of said voltage pumping circuit according to results of said detected supply voltage; and
   means for receiving said substrate voltage control signal and said pumped-up voltage control signal and generating a pulse control signal, said means for generating pulses being responsive to said pulse control signal.

2. A constant voltage generator comprising:
   a substrate voltage pumping circuit for generating a substrate voltage;
   a substrate voltage detecting circuit for detecting said substrate voltage output from said substrate voltage pumping circuit and generating a substrate voltage control signal;
   a voltage pumping circuit for generating a pumped-up voltage;
   a pumped-up voltage detecting circuit for detecting the pumped-up voltage output from said voltage pumping circuit and generating a pumped-up voltage control signal;
   an oscillator coupled commonly to said substrate voltage pumping circuit and said voltage pumping circuit, for generating pulses;
   a substrate voltage driving circuit for receiving the pulses output from said oscillator and generating a first driving signal supplied to said substrate voltage pumping circuit in response to said substrate voltage control signal;
   a voltage pumping driving circuit for receiving the pulses output from said oscillator and generating a second driving signal supplied to said voltage pumping circuit in response to said pumped-up voltage control signal; and
   means for receiving said substrate voltage control signal and said pumped-up voltage control signal and generating an oscillator control signal, said oscillator being responsive to said oscillator control signal;
   whereby said substrate voltage pumping circuit and said pumping voltage circuit operate independently of each other in response to the pulses output from said single oscillator.

3. A constant voltage generator as in claim 2, wherein said means for generating an oscillator control signal comprises a NOR gate receiving said substrate voltage control signal and said pumped-up voltage control signal to generate said oscillator control signal.

4. A constant voltage generator as in claim 2, wherein said substrate voltage driving circuit is disabled and independent from said voltage pumping circuit when said substrate voltage is at a first level; wherein said voltage pumping driving circuit is disabled and independent from said substrate voltage pumping circuit when said pumped-up voltage is at a second level.

* * * * *